US008178158B2

(12) United States Patent
Berthold et al.

(10) Patent No.: US 8,178,158 B2
(45) Date of Patent: May 15, 2012

(54) METHOD FOR MAKING A CURRENT-PERPENDICULAR-TO-THE-PLANE GIANT MAGNETORESISTANCE (CPP-GMR) SENSOR WITH A CONFINED-CURRENT-PATH (CCP)

(75) Inventors: Thomas R. Berthold, Saratoga, CA (US); Matthew J. Carey, San Jose, CA (US); Jeffrey R. Childress, San Jose, CA (US); Jordan Asher Katine, Mountain View, CA (US); Stefan Maat, San Jose, CA (US)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 1017 days.

(21) Appl. No.: 12/131,863

(22) Filed: Jun. 2, 2008

(65) Prior Publication Data

US 2009/0297700 A1    Dec. 3, 2009

(51) Int. Cl.
*G11B 5/00* (2006.01)
*G11B 5/127* (2006.01)
*G11B 5/133* (2006.01)

(52) U.S. Cl. ......... 427/131; 427/127; 427/128; 427/130
(58) Field of Classification Search ........... 427/127–131
See application file for complete search history.

(56) References Cited

U.S. PATENT DOCUMENTS

| 6,611,034 | B2 * | 8/2003 | Den | 257/421 |
|---|---|---|---|---|
| 6,838,386 | B2 * | 1/2005 | Yamashita | 438/706 |
| 2002/0135939 | A1 * | 9/2002 | Wada | 360/135 |
| 2003/0189791 | A1 * | 10/2003 | Mayes et al. | 360/131 |
| 2005/0002126 | A1 | 1/2005 | Fujiwara et al. | |
| 2005/0047025 | A1 * | 3/2005 | Lin et al. | 360/319 |
| 2006/0257931 | A1 | 11/2006 | Yamashita et al. | |
| 2007/0097558 | A1 * | 5/2007 | Carey et al. | 360/324.1 |

OTHER PUBLICATIONS

Hirono "Superhard conductive carbon nanocrystallite films" Jan. 21, 2002 Applied Phys Let. vol. 80 No. 3; p. 425-427.*
Oshima et al., "Current-perpendicular spin valves with partially oxidized magnetic layers for ultrahigh-density magnetic recording", IEEE Transactions on Magnetics, vol. 39, No. 5, Sep. 2003, pp. 2377-2380.
Fukuzawa, et al., "MR Enhancement by NOL Current Confined Path Structures in CPP Spin Valves", IEEE Transactions on Magnetics, vol. 40, No. 4, Jul. 2004, pp. 2236-2238.

(Continued)

*Primary Examiner* — Timothy Meeks
*Assistant Examiner* — Mandy Louie
(74) *Attorney, Agent, or Firm* — Thomas R. Berthold

(57) ABSTRACT

A method of making a current-perpendicular-to-the-plane giant magnetoresistive (CPP-GMR) sensor with a confined-current-path (CCP) layer uses an array of self-assembled ferritin protein molecules with inorganic cores to make the CCP layer in the sensor stack. In one embodiment, the ferritin molecules with cores of insulating oxide particles are deposited on an electrically conductive support layer and the ferritin molecules are dissolved, leaving an array of insulating oxide particles. An electrically conducting layer is deposited over the oxide particles and into the regions between the oxide particles to form the CCP layer. In another embodiment, the ferritin molecules with inorganic particles in their cores are deposited on an electrically insulating support layer and the ferritin molecules are dissolved, leaving an array of inorganic particles that function as an etch mask. The insulating support layer is then etched through the mask to form vias down to the underlying layer on which the support layer is formed. An electrically conducting layer is then deposited to form the CCP layer.

2 Claims, 10 Drawing Sheets

OTHER PUBLICATIONS

Fujiwara, et al., "Magnetic and Transport Properties of GMR/Spin-Valves and Their Components", University of Alabama Materials for Information Technology (MINT) Spring Review, Apr. 2002.

Yamashita, "Fabrication of a two-dimensional array of nano-particles using ferritin molecule", Thin Solid Films, vol. 393, Issues 1-2, Aug. 1, 2001, pp. 12-18.

Kubota et al., "A 7-nm nanocolumn structure fabricated by using a ferritin iron-core mask and low-energy CI neutral beams", Appl. Phys. Lett. 84, 1555 (2004).

Kubota, et al., "Low-damage fabrication of high aspect nanocolumns by using neutral beams and ferritin-iron-core mask", Journal of Vacuum Science & Technology B: Microelectronics and Nanometer Structures, May 2007, vol. 25, Issue 3, pp. 760-766.

Matsui et. al., "Realizing a Two-Dimensional Ordered Array of Ferritin Molecules Directly on a Solid Surface Utilizing Carbonaceous Material Affinity Peptites", Langmuir 2007, 23, 1615-1618.

Matsui et al., "Direct Production of a Two-Dimensional Ordered Array of Ferritin-Nanoparticles on a Silicon Substrate", Japanese Journal of Applied Physics, vol. 46, Issue 28, pp. L713-L715 (2007).

Yamashita, "Bio Nano Process: Fabrication of Nanoelectronic Devices Using Protein Supramolecules", Electron Devices Meeting, 2006, IEDM '06 International, Publication Date: Dec. 11-13, 2006, pp. 1-4.

Ichikawa, et al., "Low-temperature Polycrystalline Silicon Thin Film Transistor Flash Memory with Ferritin", Japanese Journal of Applied Physics vol. 46, No. 34, 2007, pp. L804-L806.

Yamamoto et al., "Surface Potential Difference of Biomineralized Inorganic Nanodot by Kelvin Probe Force Microscopy", Japanese Journal of Applied Physics, vol. 46, No. 8B, 2007, pp. 5647-5651.

* cited by examiner

METHOD FOR MAKING A CURRENT-PERPENDICULAR-TO-THE-PLANE GIANT MAGNETORESISTANCE (CPP-GMR) SENSOR WITH A CONFINED-CURRENT-PATH (CCP)

BACKGROUND OF THE INVENTION

1. Field of the Invention

The invention relates generally to a method for making a current-perpendicular-to-the-plane (CPP) giant magnetoresistance (GMR) sensor that operates with the sense current directed perpendicularly to the planes of the layers making up the sensor stack, and more particularly to method for making a CPP-GMR sensor with a confined-current-path (CCP) for the sense current.

2. Background of the Invention

One type of conventional magnetoresistive sensor used as the read head in magnetic recording disk drives is a sensor based on the giant magnetoresistance (GMR) effect. A GMR sensor has a stack of layers that includes two ferromagnetic layers separated by a nonmagnetic electrically conductive spacer layer, which is typically copper (Cu). In one type of GMR sensor, called a "spin-valve" (SV), one ferromagnetic layer has its magnetization direction fixed, such as by being pinned by exchange coupling with an adjacent antiferromagnetic layer, and the other ferromagnetic layer has its magnetization direction "free" to rotate in the presence of an external magnetic field. With a sense current applied to the sensor, the rotation of the free-layer magnetization relative to the fixed-layer magnetization is detectable as a change in electrical resistance. The magnetoresistance of the sensor is measured as ($\Delta R/R$), where $\Delta R$ is the maximum change in resistance.

In a magnetic recording disk drive read sensor or head, the magnetization of the fixed or pinned layer is generally perpendicular to the plane of the disk, and the magnetization of the free layer is generally parallel to the plane of the disk in the absence of an external magnetic field. When exposed to an external magnetic field from the recorded data on the disk, the free-layer magnetization will rotate, causing a change in electrical resistance. If the sense current flowing through the sensor is directed parallel to the planes of the layers in the sensor stack, the sensor is referred to as a current-in-the-plane (CIP) sensor, while if the sense current is directed perpendicular to the planes of the layers in the sensor stack, it is referred to as current-perpendicular-to-the-plane (CPP) sensor.

In CPP-GMR sensors, because the sense current flows perpendicular to all the layers in the sensor stack, the resistance of the active region (the free layer, spacer layer and pinned layer in a SV) is a relatively small part of the total resistance of the sensor. Due to its high resistivity, the antiferromagnetic layer can account for more than 90% of the total stack resistance. It is thus desirable to increase the resistance of the active region without significantly increasing the total resistance. One approach to achieving this is sometimes called a confined-current-path (CCP) sensor, wherein the sense current is forced to pass though only a portion of the area of the sensor stack. One type of CCP CPP-GMR sensor has a CCP layer in the form of a partially-oxidized nano-oxide layer (NOL) in the active region, typically in the conductive spacer layer. The sense current is confined to flow only though the conductive non-oxidized areas of the NOL. The NOL thus increases the resistance of the active region (which also contributes to the $\Delta R$) preferentially over that of the inactive regions (which only contribute to R) and therefore increases the overall magnetoresistance ($\Delta R/R$) of the sensor. CPP-GMR sensors with NOLs are described by Oshima et al., "Current-perpendicular spin valves with partially oxidized magnetic layers for ultrahigh-density magnetic recording", *IEEE Transactions on Magnetics*, Vol. 39, No. 5, September 2003, pp. 2377-2380; and by Fukuzawa, et al., "MR Enhancement by NOL Current-Confined-Path Structures in CPP Spin Valves", *IEEE Transactions on Magnetics*, Vol. 40, No. 4, July 2004, pp. 2236-2238.

Because the formation of the conductive paths in the NOL is by oxidation and annealing of a very thin layer, the number and size of the conductive non-oxidized areas depends on the material properties, layer thickness, oxidation time, and anneal conditions. As a result it is difficult to reliably manufacture large quantities of CCP CPP-GMR sensors with NOLs with predictable values of R and $\Delta R/R$. In addition, the conductive non-oxidized areas of the NOL are generally randomly distributed across the entire plane of the spacer layer. Fujiwara, et al., "Magnetic and Transport Properties of GMR/Spin-Valves and Their Components", University of Alabama Materials for Information Technology (MINT) Spring Review, April, 2002, proposes a CCP CPP-GMR sensor wherein generally evenly distributed pin holes that function as confined current paths can be lithographically formed in the sensor stack.

It has been demonstrated that some cage-shaped proteins, such as ferritin or apo-ferritin (in the following just called ferritin), which feature both biomineralization in their inner cavity and the ability to self-assemble into nanostructures, can be used to build inorganic nanostructures for use in semiconductor devices. Ferritin is a supramolecular protein having a generally spherical shell with inner and outer diameters of 7 nm and 12 nm, respectively. There are narrow channels connecting the outside of the ferritin molecule with its inner cavity, through which ions can enter and mineralize into inorganic particles which form a core within the ferritin shell. Ferritin proteins have been prepared with inorganic Co-oxide, Cr-oxide, Fe-oxide, and ferrihydrite cores. It has been shown that other even smaller cage-shaped proteins like Lis-Dps with inner and outer diameters of 4.5 nm and 9 nm, respectively, can be used for the same task. It has been demonstrated that ferritin molecules can be modified to have peptides with specific affinity to a target material, such as a carbon (C) or titanium (Ti) surface. These modified ferritin molecules are attracted to the carbon or titanium surface and to each other to self-assemble into a two-dimensional hexagonal close-packed array of high density and uniformity. After the proteins are attached to the target surface the ferritin molecules can be dissolved by heat or an ultraviolet (UV)/ozone process, leaving behind a regularly-spaced array of the inorganic cores, which can be used as an etching mask. The above-described features of ferritin, the processes for making them, depositing them into self-assembled arrays and dissolving them are described in numerous publications, including the following:

Yamashita, "Fabrication of a two-dimensional array of nanoparticles using ferritin molecule", *Thin Solid Films*, Volume 393, Issues 1-2, 1 Aug. 2001, Pages 12-18;

Kubota et al., "A 7-nm nanocolumn structure fabricated by using a ferritin iron-core mask and low-energy Cl neutral beams", *Appl. Phys. Lett.* 84, 1555 (2004);

Kubota, et al., "Low-damage fabrication of high aspect nanocolumns by using neutral beams and ferritin-iron-core mask", *Journal of Vacuum Science & Technology B: Microelectronics and Nanometer Structures*, May 2007, Volume 25, Issue 3, pp. 760-766;

T. Matsui et. al., "Realizing a Two-Dimensional Ordered Array of Ferritin Molecules Directly on a Solid Surface Utilizing Carbonaceous Material Affinity Peptites", *Langmuir* 2007, 23, 1615-1618; and T. Matsui et al., "Direct Production of a Two-Dimensional Ordered Array of Ferritin-Nanoparticles on a Silicon Substrate", *Japanese Journal of Applied Physics*, Volume 46, Issue 28, pp. L713-L715 (2007).

What is needed is a CCP CPP-GMR sensor that can be manufactured using ferritin molecules to control the size and location of conductive areas in a CCP layer in the sensor stack.

SUMMARY OF THE INVENTION

The invention relates to a method of making a CPP-GMR sensor using an array of self-assembled ferritin molecules with inorganic cores to make a CCP layer in the sensor stack. In one embodiment of the method, the ferritin molecules with cores of insulating oxide particles are deposited as a self-assembled array on an electrically conductive support layer. The ferritin molecules are dissolved, leaving an array of insulating oxide particles on the support layer, and an electrically conducting layer is deposited over the oxide particles and into the regions between the oxide particles onto the support layer, resulting in the formation of the CCP layer. In another embodiment of the method, the ferritin molecules with inorganic particles in their cores are deposited as a self-assembled array on an electrically insulating support layer. The ferritin molecules are dissolved, leaving an array of inorganic particles that function as an etch mask. The insulating support layer is then etched through the mask, leaving an array of columns of insulating support layer material beneath the particles and forming vias down to the underlying layer on which the support layer is formed. An electrically conducting layer is then deposited over the array of columns and into the vias to form the CCP layer.

For a fuller understanding of the nature and advantages of the present invention, reference should be made to the following detailed description taken together with the accompanying figures.

DETAILED DESCRIPTION OF THE INVENTION

Figure 1:
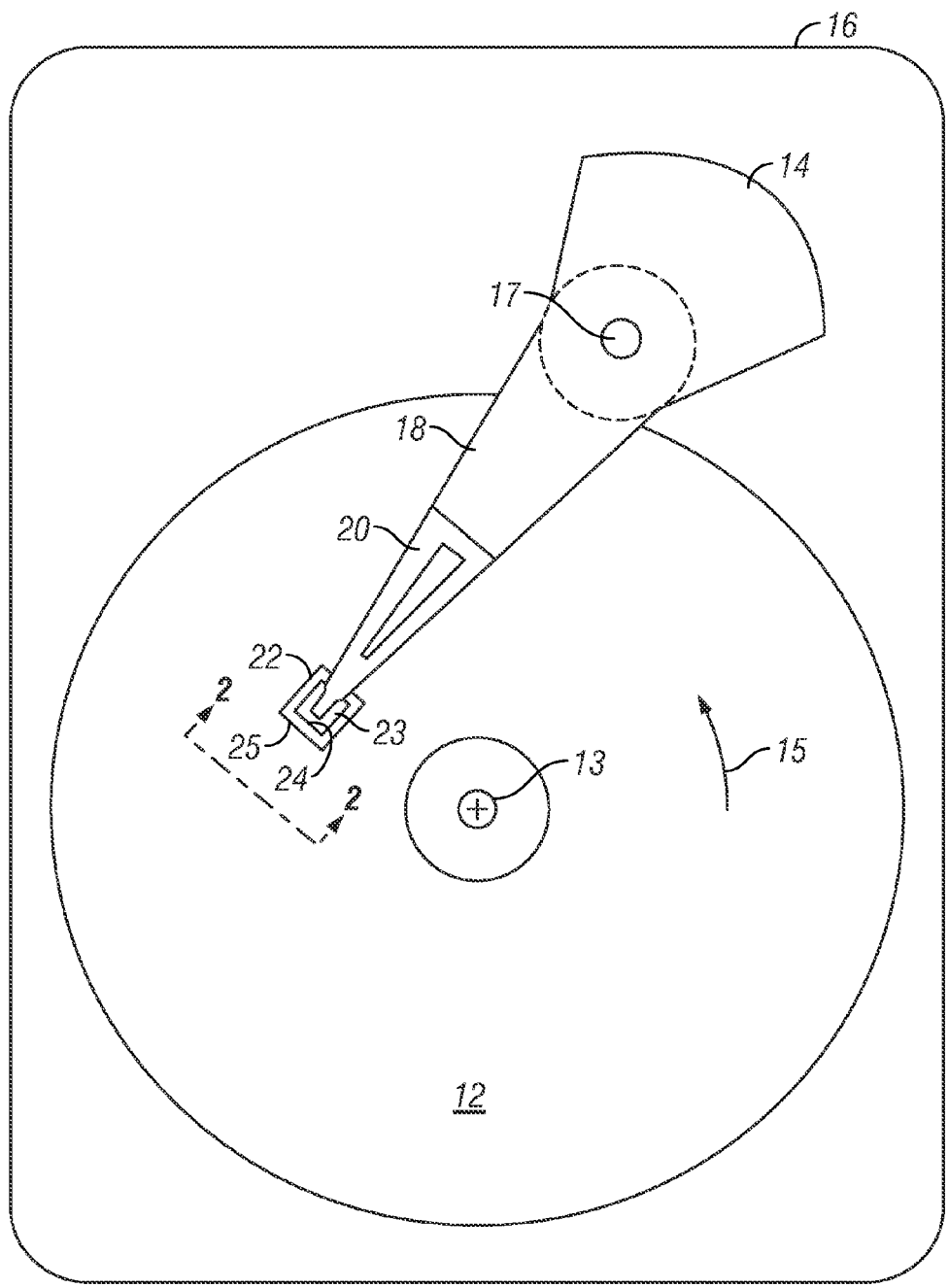
FIG. 1 is a schematic top view of a conventional magnetic recording hard disk drive with the cover removed.

A spin-valve (SV) type of CPP-GMR read head has application for use in a magnetic recording disk drive, the operation of which will be briefly described with reference to FIGS. 1-3. FIG. 1 is a block diagram of a conventional magnetic recording hard disk drive. The disk drive includes a magnetic recording disk 12 and a rotary voice coil motor (VCM) actuator 14 supported on a disk drive housing or base 16. The disk 12 has a center of rotation 13 and is rotated in direction 15 by a spindle motor (not shown) mounted to base 16. The actuator 14 pivots about axis 17 and includes a rigid actuator arm 18. A generally flexible suspension 20 includes a flexure element 23 and is attached to the end of arm 18. A head carrier or air-bearing slider 22 is attached to the flexure 23. A magnetic recording read/write head 24 is formed on the trailing surface 25 of slider 22. The flexure 23 and suspension 20 enable the slider to "pitch" and "roll" on an air-bearing generated by the rotating disk 12. Typically, there are multiple disks stacked on a hub that is rotated by the spindle motor, with a separate slider and read/write head associated with each disk surface.

Figure 2:
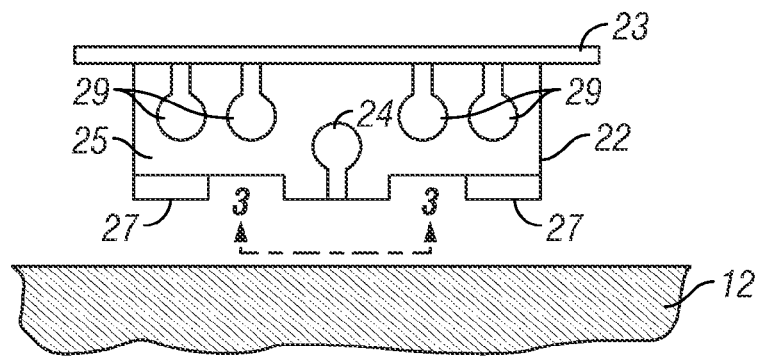
FIG. 2 is an enlarged end view of the slider and a section of the disk taken in the direction 2-2 in FIG. 1.

FIG. 2 is an enlarged end view of the slider 22 and a section of the disk 12 taken in the direction 2-2 in FIG. 1. The slider 22 is attached to flexure 23 and has an air-bearing surface (ABS) 27 facing the disk 12 and a trailing surface 25 generally perpendicular to the ABS. The ABS 27 causes the airflow from the rotating disk 12 to generate a bearing of air that supports the slider 22 in very close proximity to or near contact with the surface of disk 12. The read/write head 24 is formed on the trailing surface 25 and is connected to the disk drive read/write electronics by electrical connection to terminal pads 29 on the trailing surface 25.

Figure 3:
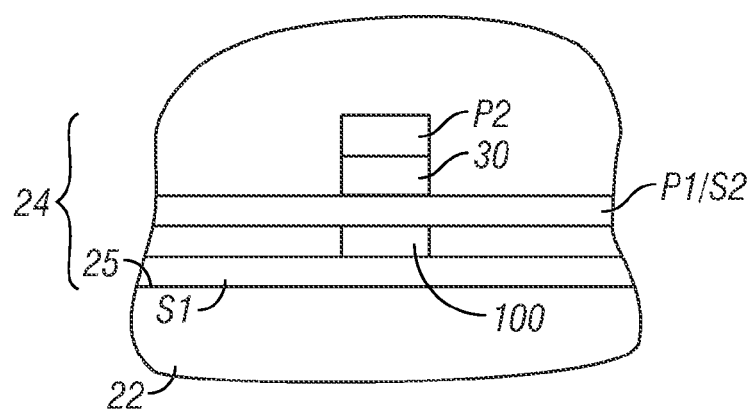
FIG. 3 is a view in the direction 3-3 of FIG. 2 and shows the ends of the read/write head as viewed from the disk.

FIG. 3 is a view in the direction 3-3 of FIG. 2 and shows the ends of read/write head 24 as viewed from the disk 12. The read/write head 24 is a series of thin films deposited and lithographically patterned on the trailing surface 25 of slider 22. The write head includes magnetic write poles P1 and P2 separated by a write gap 30. The CPP-SV magnetoresistive sensor or read head 100 is located between two magnetic shields S1 and S2. The layers S2 and P1 may constitute a single shared pole P1/S2. which serves as both second read shield and first write pole for the write head. The shields S1, S2 are formed of magnetically permeable material and are electrically conductive so they can function as the electrical leads to the read head 100. Separate electrical leads may also be used, in which case the read head 100 is formed in contact with layers of electrically conducting lead material, such as tantalum, gold, or copper, that are in contact with the shields S1, S2.

Figure 4:
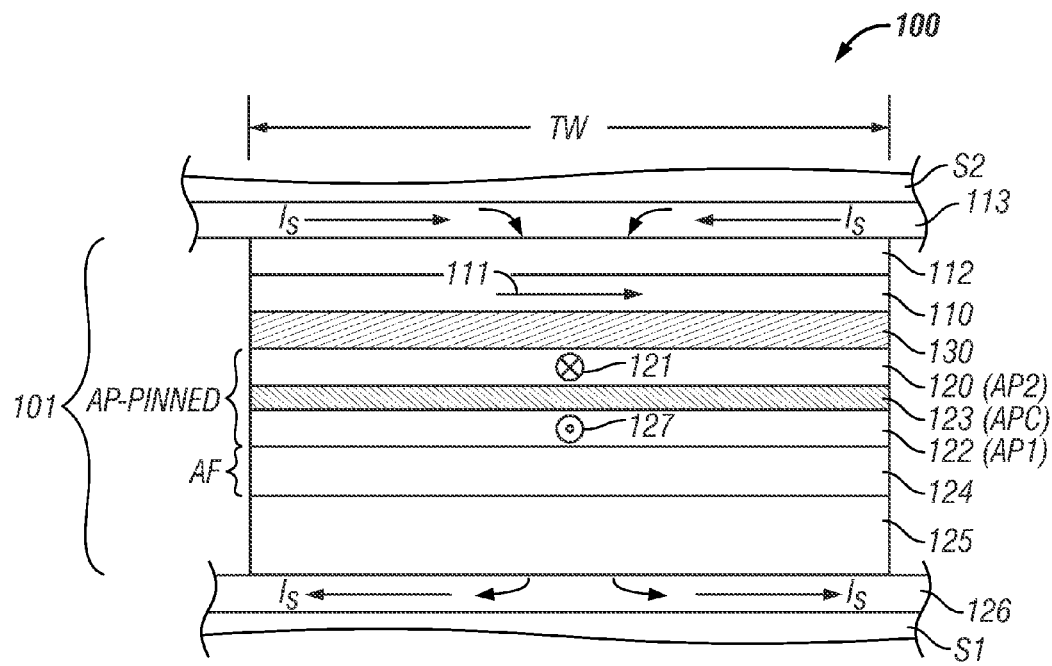
FIG. 4 is a cross-sectional schematic view of a CPP-SV read head showing the stack of layers located between the magnetic shield layers.

FIG. 4 is an enlarged sectional view as seen from the ABS showing the layers making up sensor 100. Sensor 100 is a CPP-SV read head comprising a stack 101 of layers formed between two electrical lead layers 126, 113. Lower lead layer 126 is formed on a lower magnetic shield layer S1, and upper lead layer 113 is located below upper magnetic shield layer S2. Shield layers S1, S2 are typically electroplated NiFe alloy films. The lower shield S1 is typically polished by chemical-mechanical polishing (CMP) to provide a smooth substrate for the growth of the lead layer 126 and sensor stack 101. The sensor stack 101 is patterned to have a trackwidth (TW) and includes a reference ferromagnetic layer 120 having a fixed magnetic moment or magnetization direction 121 oriented transversely (into the page), a free ferromagnetic layer 110 having a magnetic moment or magnetization direction 111 that can rotate in the plane of layer 110 in response to transverse external magnetic fields from the disk 12, and an electrically conducting spacer layer 130, typically copper (Cu), between the reference layer 120 and free layer 110.

The CPP-SV read head is depicted in FIG. 4 with the reference layer 120 being part of the well-known antiparallel (AP) pinned structure, also called a "laminated" pinned layer, as described in U.S. Pat. No. 5,465,185. The AP-pinned structure minimizes magnetostatic coupling of the reference layer 120 with the free layer 110. The AP-pinned structure includes the reference ferromagnetic (AP2) layer 120 and a lower ferromagnetic (AP1) layer 122 that are antiferromagnetically coupled across an AP coupling (APC) layer 123, such as Ru, Ir, Rh, or Cr. The AP1 and AP2 ferromagnetic layers have their respective magnetization directions 127, 121 oriented antiparallel. The AP-pinned structure may be "self-pinned" or the AP1 layer 122 may have its magnetization direction pinned by being exchange-coupled to an antiferromagnetic (AF) layer 124 or pinned by a hard magnetic layer such as CoPt or CoPtCr. While a CPP-SV read head with an AP-pinned structure is depicted in FIG. 4, the CPP-SV may instead use a "simple-pinned" structure, in which case a single ferromagnetic pinned layer would replace the AP-pinned structure and would have its magnetization direction pinned by being exchange-coupled to AF layer 124.

Located between the lower shield layer S1 and the AP-pinned structure are the bottom electrical lead 126 and a seed layer 125. The seed layer 125 may be a single layer or multiple layers of different materials. Located between the free ferromagnetic layer 110 and the upper shield layer S2 are a capping layer 112 and the top electrical lead 113. The capping layer 112 may be a single layer or multiple layers of different materials, such as a Cu/Ru/Ta trilayer. The electrical leads 126, 113 are optional because the shields S1, S2 are electrically conductive and can function as the electrical leads to the sensor stack 101.

In the presence of an external magnetic field in the range of interest, i.e., magnetic fields from recorded data on the disk 12, the magnetization direction 111 of free layer 110 will rotate while the magnetization direction 121 of reference layer 120 will remain fixed and not rotate. Thus when a sense current $I_S$ is applied from top lead 113 perpendicularly through the stack to bottom lead 126, the magnetic fields from the recorded data on the disk will cause rotation of the free-layer magnetization 111 relative to the reference-layer magnetization 121, which is detectable as a change in electrical resistance.

The leads 126, 113 are typically Ta or Rh. However, a lower resistance material may also be used. They are optional and used to adjust the shield-to-shield spacing. If the leads 126 and 113 are not present, the bottom and top shields S1 and S2 are used as leads. The seed layer 125 is typically one or more layers of NiFeCr, NiFe, Ta, Cu or Ru. The AF layer 124 is typically a Mn alloy, e.g., PtMn, NiMn, FeMn, IrMn, IrMnCr, PdMn, PtPdMn or RhMn. If a hard magnetic layer is used instead of an AF layer it is typically a CoPt or FePt alloy, for example CoPtCr. The capping layer 112 provides corrosion protection and is typically formed of Ru or Ta.

The ferromagnetic layers 122 (AP1), 120 (AP2), and 110 (free layer) are typically formed of Co, Fe or Ni, one of their alloys, or a multilayer of these materials, such as a CoFe/NiFe bilayer. A CoFe/NiFe bilayer is often used in the free layer. For example, AP2 layer 120 may be a CoFe alloy, typically 10 to 50 Å thick, and the free ferromagnetic layer 110 may be a bilayer of a CoFe alloy, typically 10-15 Å thick and formed on the spacer layer 130, with a NiFe alloy, typically 10-40 Å thick, formed on the CoFe layer of the bilayer. The APC layer in the AP-pinned structure is typically Ru or Ir with a thickness between about 4-10 Å.

A hard magnetic layer (not shown), such as a CoPt or CoCrPt layer, may also be included outside the sensor stack near the side edges of the free ferromagnetic layer 110 or in the stack for magnetic stabilization or longitudinal biasing of the free ferromagnetic layer 110.

One or more of the free layer 110, the AP2 layer 120, the capping layer 112 and the conductive nonmagnetic spacer layer 130 may also include a nano-oxide layer (NOL) that functions as a confined-current path (CCP) layer to locally confine the current path and increase the effective resistivity. A CoFe NOL may be formed, for example, by interrupting the deposition after some CoFe has been deposited somewhere in the free layer, the AP2 layer, the capping layer, or the conductive spacer layer and oxidizing its surface for several minutes in an $O_2$ or $O_2$/Ar gas at 0.1-10 Torr. NOLs can be formed by oxidizing other materials, e.g., Cu—Al or Cu—Ti alloys.

Figure 5:
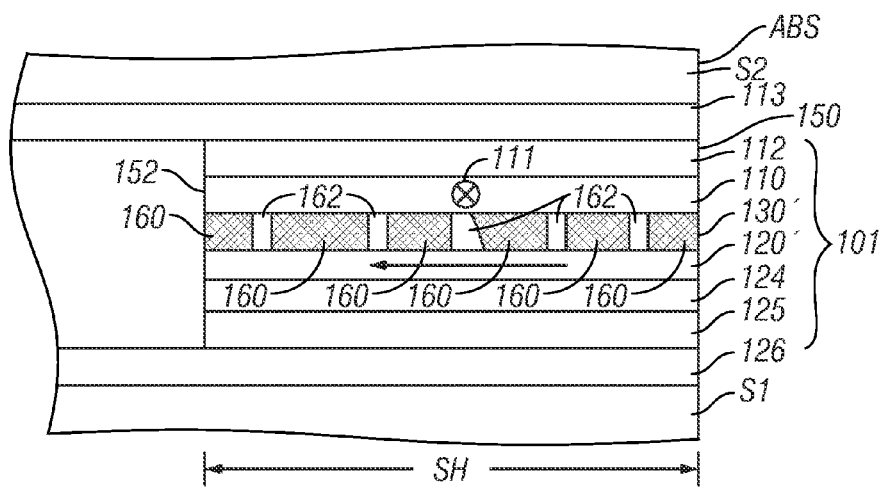
FIG. 5 is a side sectional view of a CPP-SV read head like that in FIG. 4 but with a nano-oxide layer (NOL) in the spacer layer and with a simple pinned layer instead of an AP-pinned structure.

FIG. 5 is a side sectional view of a prior art CPP-SV read head like that in FIG. 4 with a NOL in the spacer layer 130' and with a simple pinned layer 120' instead of an AP-pinned structure. The sensor stack 101 has a first or sensing edge 150 at the ABS and a second or back edge 152 located a distance called the "stripe height" (SH) from the sensing edge. The area A of the sensor stack through which the sense current flows is thus given approximately by TW×SH. The spacer layer 130' may be formed by oxidizing a Cu—Al alloy to form nonconductive alumina ($Al_2O_3$) regions 160 and conductive Cu regions 162. The sense current through the sensor stack is substantially confined to flow through the conductive regions 162 of spacer layer 130'. This type of NOL and the method for making it are described by Fukuzawa, et al., "MR Enhancement by NOL Current-Confined-Path Structures in CPP Spin Valves", *IEEE Transactions on Magnetics*, Vol. 40, No. 4, July 2004, pp. 2236-2238, and in U.S. Pat. No. 6,686,068. Because the nonconductive regions 160 are formed by oxidation of the entire spacer layer, the conductive regions 162 are generally randomly distributed within the entire spacer layer 130' between the sensing and back edges 150, 152, respectively. Also, the size and location of the conductive regions 162 can not be easily controlled because the extent of oxidation of the spacer layer is determined by many factors.

The present invention is a method for making a CCP-GMR sensor, like the prior art CCP-SV read head shown in FIGS. 4 and 5, but wherein the NOL 130' is replaced with a CCP layer formed with a process using ferritin molecules. FIGS. 6A-6F illustrate one embodiment of the method of the present invention. In this embodiment, the inorganic cores of the ferritin molecules remain as an array of insulating oxide particles in the CCP layer.

Figure 6A:
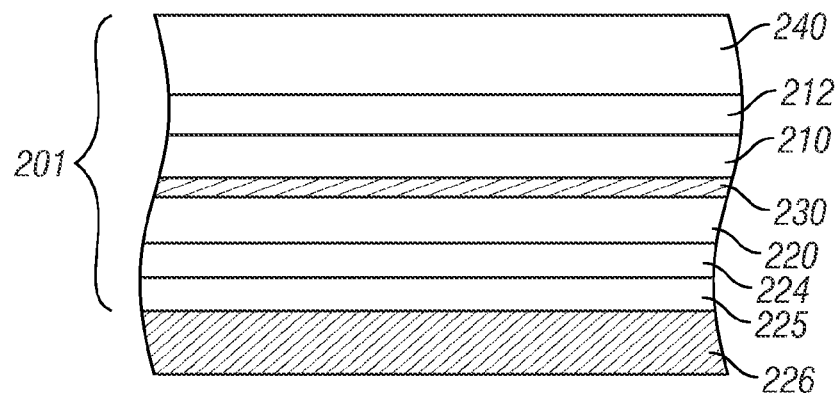
FIGS. 6A-6F illustrate steps in one embodiment of the method of the present invention wherein the inorganic cores of the ferritin molecules remain as an array of insulating oxide particles in the CCP layer.
Figure 6B:
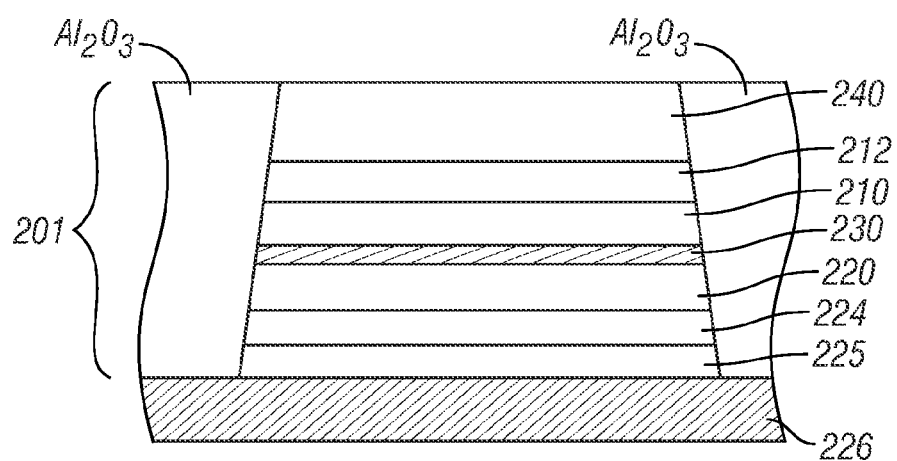
Figure 6C:
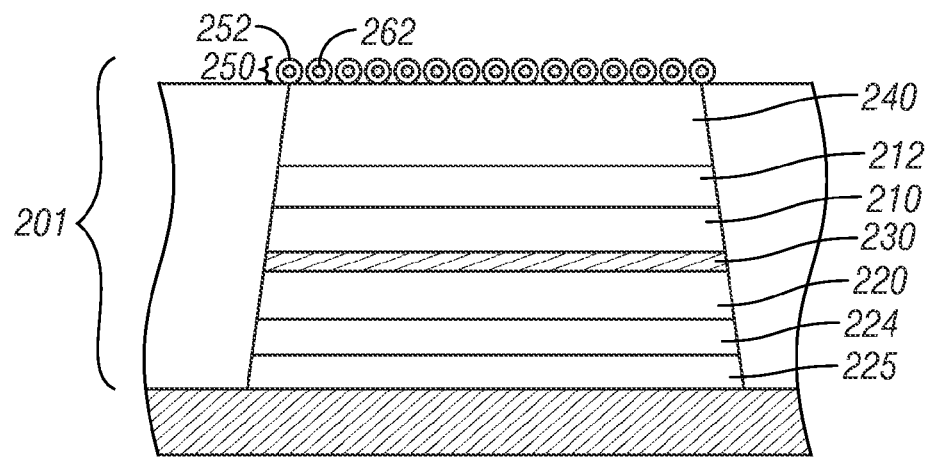
Figure 6D:
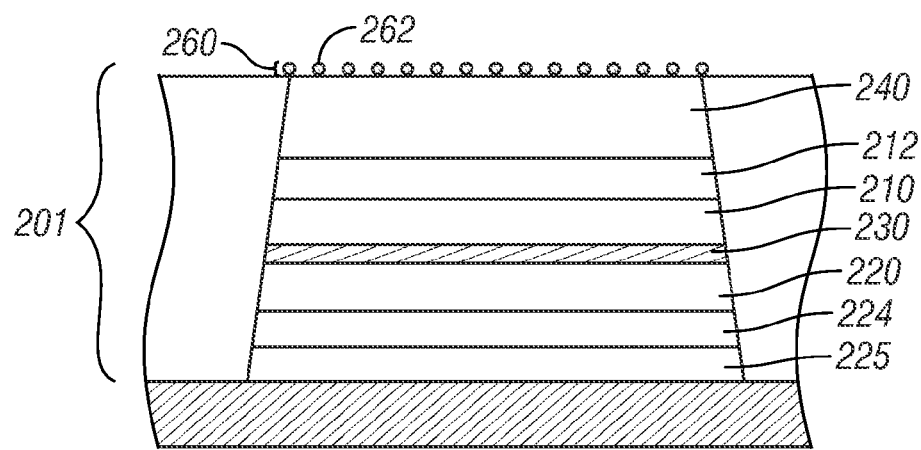
Figure 6E:
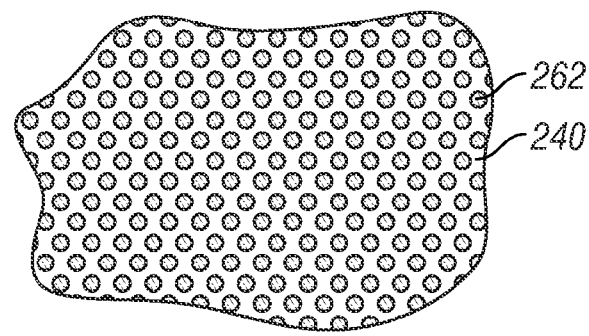
Figure 6F:
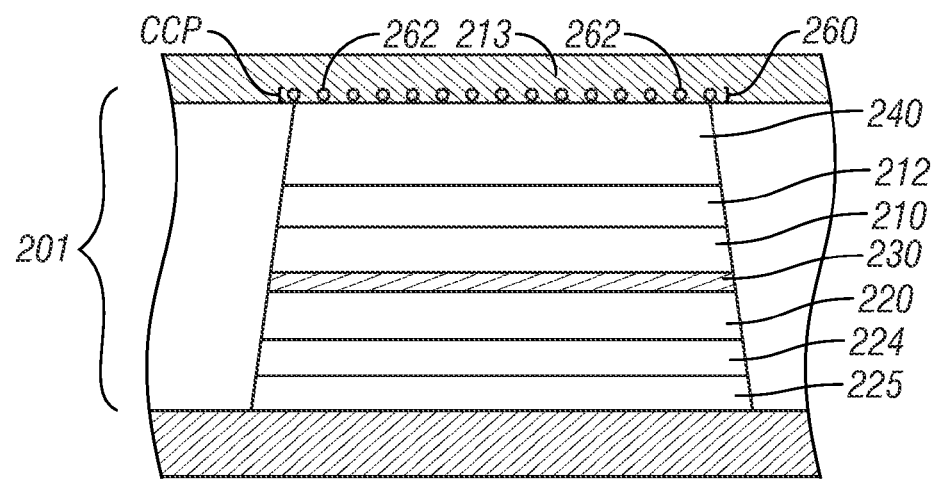

FIG. 6A shows the layers making up the sensor stack 201 formed on the first electrical lead layer 226. The stack of layers include seed layer 225, AF layer 224, pinned ferromagnetic layer 220, conductive spacer layer 230, free ferromagnetic layer 210, capping layer 212 and a support layer 240. Support layer 240 is formed of electrically conducting material and will become part of the CCP layer in the sensor stack 201. FIG. 6B shows the structure after full-film lithographic patterning to define the shape of the sensor and refilling around the sides of the sensor with insulating material like alumina ($Al_2O_3$). The structure typically also comprises magnetic hard bias layers on each side of the stack that stabilize the sensing layer generally parallel to the ABS. Typical hard bias materials are CoPt or CoPtCr layers deposited on Cr or Cr-alloy underlayers. For simplicity the hard bias is not shown here. In FIG. 6C an array of self-assembled ferritin molecules has been deposited on support layer 240. The ferritin molecules are modified with peptides that attract each other and also have the affinity for a specific target material so as to self-assemble on a target surface. For example, support layer 240 may be formed of a 5-25 Å thick Ti layer and the ferritin molecules are modified with a peptide that binds the ferritin molecules to Ti, as described in the previously-cited articles and in US 2006/0257931 A1. The ferritin molecules contain an inorganic particle within their cavities, as depicted by typical ferritin molecule 252 with inorganic particle 262. The inorganic particles are formed of an insulating material, like an oxide of Fe, Co or Cr. FIG. 6D shows the structure after the ferritin molecules have been removed, leaving the ferritin cores as an array 260 of insulating oxide particles 262. The ferritin is dissolved by heat treatment or an ultraviolet (UV)/ozone process. FIG. 6E is a top view of a portion of the surface of support layer 240 with the array 260 of oxide particles 262, and shows the array as generally a two-dimensional hexagonal close-packed array of nano-sized particles 262. The center-to-center spacing of the particles 262 is determined by the size of the dissolved protein shells (typically about 12 nm). The processes of formulating the ferritin, modifying the ferritin with peptides, depositing the ferritin to self-assemble as an array of molecules, and dissolving the ferritin are all well-known in the art and not part of the present invention. Next, in FIG. 6F, a cover layer of electrically conductive material, like Au, is then deposited on the oxide particles 262 and support layer 240. This forms the top electrical lead layer 213. It also forms the CCP layer in the sensor stack 201. The CCP layer is the array 260 of oxide particles 262 and the portion of electrical lead material located on support layer 240 in the regions between the oxide particles 262. The non-conducting oxide particles 262 are generally equally sized and evenly spaced on the conductive support layer 240. Thus it is possible to reliably manufacture large quantities of CCP CPP-GMR sensors with predictable values of R and ΔR/R.

In the method of FIGS. 6A-6F, the CCP layer is formed on the conductive capping layer 212. However, the capping layer 212 may itself function as the support layer, with the array 260 of insulating inorganic particles 262 being formed on the capping layer 212, and the electrical lead material then deposited over the particles onto the capping layer 212 to simultaneously form the CCP layer and the top electrical lead 213. Also, the CCP layer may be formed at other locations in the sensor stack 201.

In the method of FIGS. 6A-6F, the sensor stack is first lithographically patterned to define the sensor shape and then the sides of the sensor re-filled with alumina, as shown in FIG. 6B. However, it is possible that all of the steps shown in FIGS. 6C-6F can be performed at the full film level, after which the sensor stack and top lead layer 213 are lithographically patterned to define the sensor shape and then the sides of the sensor re-filled with alumina.

Figure 7A:
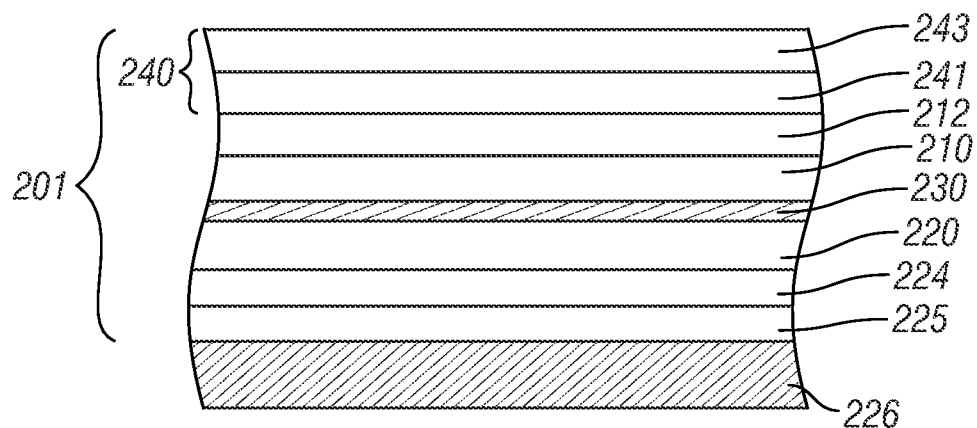
FIGS. 7A-7G illustrate steps in another embodiment of the method of the present invention wherein the inorganic cores of the ferritin molecules function as an etch mask during fabrication of the CCP layer.
Figure 7B:
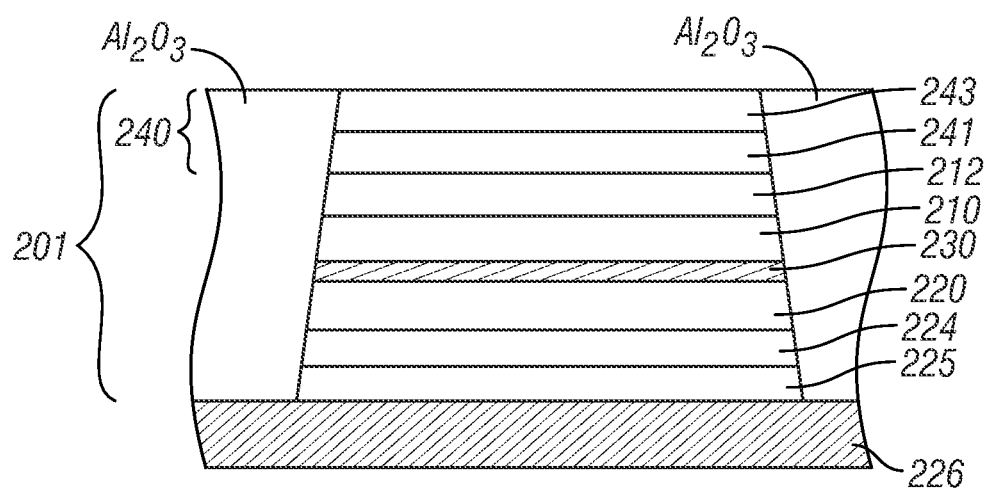
Figure 7C:
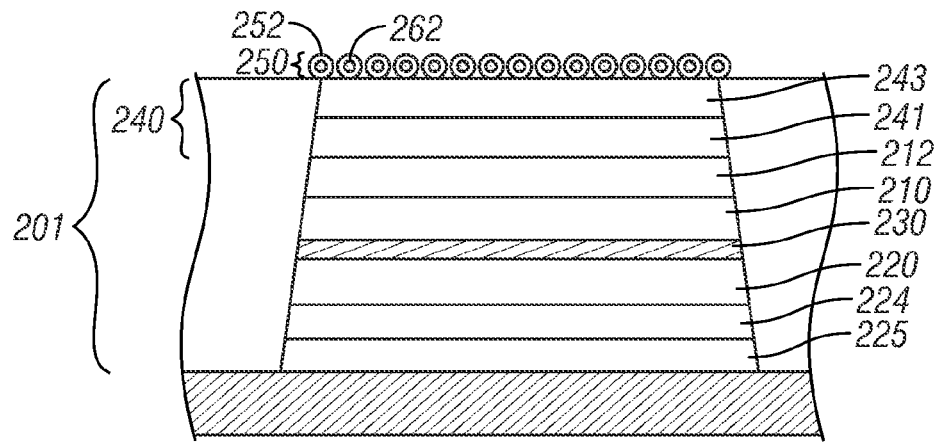
Figure 7D:
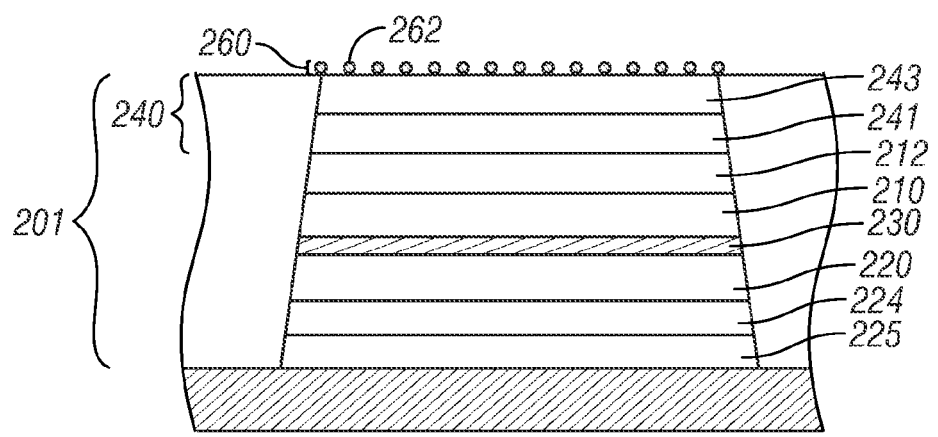
Figure 7E:
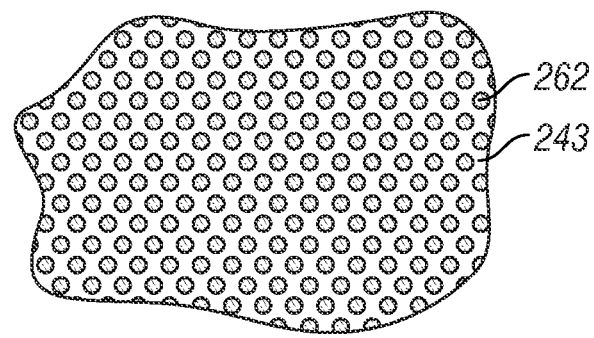
Figure 7F:
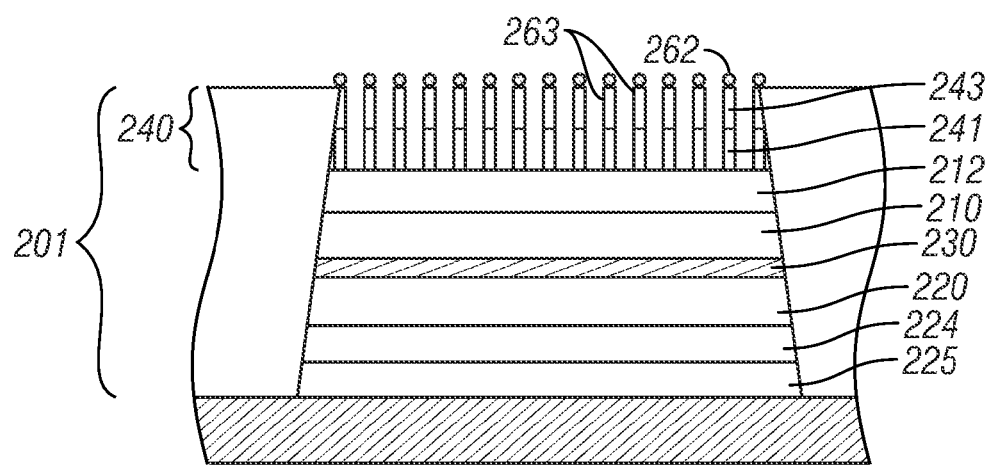
Figure 7G:
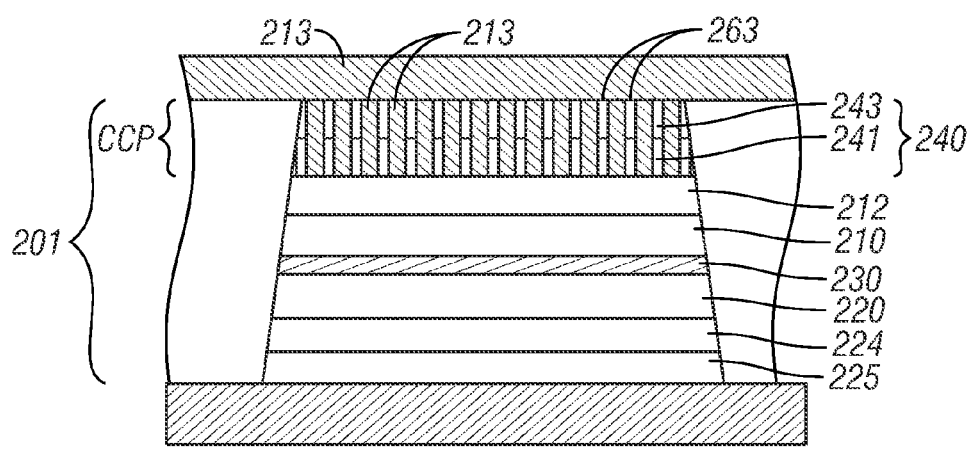

FIGS. 7A-7G illustrate another embodiment of the method of the present invention. In this embodiment, the inorganic cores of the ferritin molecules function as an etch mask. FIG. 7A shows the layers making up the sensor stack 201 formed on the first electrical lead layer 226. The stack of layers include seed layer 225, AF layer 224, pinned ferromagnetic layer 220, conductive spacer layer 230, free ferromagnetic layer 210, capping layer 212 and a bilayer support layer 240. Support layer 240 is a bilayer of an electrically insulating first layer 241 on capping layer 212 and an electrically conductive second layer 243 on first layer 241. The first layer 241 may be formed of alumina, SiO$_2$ or other suitable insulating material. A typical thickness of the insulating layer 241 is about 5-25 Å. The bilayer support layer 240 will become part of the CCP layer in the sensor stack 201. FIG. 7B shows the structure after full-film lithographic patterning to define the shape of the sensor and refilling around the sides of the sensor with insulating material like alumina ($Al_2O_3$). In FIG. 7C an array of self-assembled ferritin molecules has been deposited on conductive layer 243. The ferritin molecules are modified with peptides that attract each other and also have the affinity for a specific target material so as to self-assemble on a target surface. For example, support layer 240 may be formed of Ti and the ferritin molecules are modified with a peptide that binds the ferritin molecules to Ti, as described in the previously-cited articles and in US 2006/0257931 A1. The ferritin molecules also contain an inorganic particle within their cavities, as depicted by typical ferritin molecule 252 with inorganic particle 262. The inorganic particles may be formed of an insulating material, like an oxide of Fe, Co or Cr. For example, layer 243 may be formed of a 5-25 Å thick Ti and the ferritin molecules modified with a peptide that binds the ferritin molecules to Ti. FIG. 7D shows the structure after the ferritin molecules have been removed, leaving the ferritin cores as an array 260 of inorganic nano-sized particles 262. The ferritin is dissolved by heat treatment or an ultraviolet (UV)/ozone process. FIG. 7E is a top view of a portion of the surface of layer 243 with the array 260 of inorganic particles 262, and shows the array as generally a two-dimensional hexagonal close-packed array of particles 262. The processes of formulating the ferritin, modifying the ferritin with peptides, depositing the ferritin to self-assemble as an array of molecules, and dissolving the ferritin are all well-known in the art and not part of the present invention. The array 260 of inorganic particles 262 is used as an etch mask for selectively removing portions of conductive layer 243 and insulating layer 241 to expose regions of the capping layer 212. Etching may be done by ion milling, reactive ion etching (RIE) or by use of a neutral beam, as described in the previously cited ferritin-related articles. If RIE is to be used, both the conductive layer 243 and insulating layer 241 need to be susceptible to etch chemistries. Alumina is generally not compatible with RIE, but SiO$_2$ is. Titanium and tungsten are examples of conductive layers 243 that are also compatible with RIE chemistries. Conversely, if ion milling is used to etch these layers, virtually any materials may be used. However, the layer thicknesses and materials should be chosen such that layers 243 and 241 are milled before the array of inorganic particles is consumed in the process. To minimize shadowing during the milling process, layers 241 and 243 should be made as thin as possible, and the milling should be done at normal incidence to the sample surface. FIG. 7F shows the structure after etching. The inorganic particles 262 have protected the underlying material in layers 243 and 241, resulting in the opening of vias to the underlying capping layer 212 and an array of columns 263 formed on capping layer 212 beneath the array of inorganic particles 262. In FIG. 7G, the inorganic particles 262 have been removed and a cover layer of electrically conductive material, like Au, has been deposited over the columns 263 and into the regions between the columns 263 and onto the exposed regions of underlying capping layer 212. The inorganic particles 262 may be removed by chemical-mechanical-polishing (CMP) or carbon-dioxide snow. The deposition of the cover layer material forms the top electrical lead layer 213. It also forms the CCP layer in the sensor stack 201. The CCP layer is the array of columns 263 and the portions of electrical lead material located on capping layer 212 between the columns 263. The non-conducting columns 263 are generally equally sized and evenly spaced on the capping layer 212. Thus it is possible to reliably manufacture large quantities of CCP CPP-GMR sensors with predictable values of R and ΔR/R.

In the method of FIGS. 7A-7G, as an alternative to the bilayer support layer 240, the support layer 240 may be a single layer of certain insulating material. The support layer may be a single layer of carbon or a carbonaceous material, in which case the ferritin molecules would be modified with a peptide that has an affinity for carbon, as described by T.

Matsui et. al., "Realizing a Two-Dimensional Ordered Array of Ferritin Molecules Directly on a Solid Surface Utilizing Carbonaceous Material Affinity Peptites" *Langmuir* 2007, 23, 1615-1618. The support layer may be a single layer of $SiO_2$ as described by T. Matsui et al., "Direct Production of a Two-Dimensional Ordered Array of Ferritin-Nanoparticles on a Silicon Substrate", *Japanese Journal of Applied Physics*, Volume 46, Issue 28, pp. L713-L715 (2007).

In the method of FIGS. 7A-7G, the CCP layer is formed on the conductive capping layer 212. However, the first layer 241 of support layer 240 may function as capping layer 212, with the array of columns 263 and the portions of electrical lead material between the columns 263 being formed on free layer 210. Also, the CCP layer may be formed at other locations in the sensor stack 201.

In the method of FIGS. 7A-7G, the sensor stack is first lithographically patterned to define the sensor shape and then the sides of the sensor re-filled with alumina, as shown in FIG. 7B. However, it is possible that all of the steps shown in FIGS. 7C-7G can be performed at the full film level, after which the sensor stack and top lead layer 213 are lithographically patterned to define the sensor shape and then the sides of the sensor re-filled with alumina.

While the present invention has been particularly shown and described with reference to the preferred embodiments, it will be understood by those skilled in the art that various changes in form and detail may be made without departing from the spirit and scope of the invention. Accordingly, the disclosed invention is to be considered merely as illustrative and limited in scope only as specified in the appended claims.

What is claimed is:

1. A method for making a current-perpendicular-to-the-plane (CPP) magnetoresistive sensor, the sensor having first and second electrical lead layers and a stack of sensor layers including a confined-current-path (CCP) layer between the lead layers, the method comprising:

forming an electrically conductive support layer in the stack;

depositing a self-assembled array of ferritin molecules on the support layer, the ferritin molecules having a generally spherical shape with an inner cavity and containing an inorganic particle in the cavity comprising an oxide of an element selected from Fe, Co and Cr;

removing the ferritin molecules, leaving an array of oxide particles on the support layer; and depositing an electrically conductive cover layer over the array of oxide particles, whereby the CCP layer comprises the cover layer and array of oxide particles.

2. The method of claim 1 wherein the support layer is formed of Ti and wherein the ferritin molecules contain a peptide having an affinity for Ti.

* * * * *